US008802510B2

(12) United States Patent
Chang et al.

(10) Patent No.: US 8,802,510 B2
(45) Date of Patent: Aug. 12, 2014

(54) METHODS FOR CONTROLLING LINE DIMENSIONS IN SPACER ALIGNMENT DOUBLE PATTERNING SEMICONDUCTOR PROCESSING

(75) Inventors: Chia-Wei Chang, Taichung (TW); Ryan Chia-Jen Chen, Chiaya (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 352 days.

(21) Appl. No.: 13/402,261

(22) Filed: Feb. 22, 2012

(65) Prior Publication Data

US 2013/0217233 A1    Aug. 22, 2013

(51) Int. Cl.
*H01L 21/302*    (2006.01)

(52) U.S. Cl.
USPC .......................... 438/151; 438/702; 438/736

(58) Field of Classification Search
CPC ............ H01L 29/6681; H01L 21/3065; H01L 21/3086; H01L 21/3088; H01L 29/66795; H01L 27/0886
USPC ......... 438/702, 703, 706, 736–738, 743, 744, 438/151; 430/313
See application file for complete search history.

(56) References Cited

U.S. PATENT DOCUMENTS

| | | | |
|---|---|---|---|
| 7,749,913 B2* | 7/2010 | Omura et al. ................. 438/706 |
| 7,759,239 B1* | 7/2010 | Lin et al. ....................... 438/592 |
| 7,772,069 B2* | 8/2010 | Park et al. ...................... 438/266 |
| 7,989,355 B2 | 8/2011 | Shieh et al. |
| 8,247,291 B2* | 8/2012 | Min et al. ....................... 438/257 |
| 8,513,131 B2* | 8/2013 | Cai et al. ........................ 438/696 |
| 8,546,202 B2* | 10/2013 | Tung et al. ..................... 438/151 |
| 8,546,891 B2* | 10/2013 | Chang et al. .................. 257/401 |
| 2007/0161251 A1* | 7/2007 | Tran et al. ..................... 438/725 |
| 2008/0233730 A1* | 9/2008 | Yu et al. ........................ 438/596 |
| 2009/0152645 A1* | 6/2009 | Tran .............................. 257/401 |
| 2010/0183961 A1* | 7/2010 | Shieh et al. ..................... 430/30 |
| 2010/0248153 A1* | 9/2010 | Lee et al. ...................... 430/312 |
| 2012/0147674 A1* | 6/2012 | Park et al. ................ 365/185.05 |
| 2012/0292764 A1* | 11/2012 | Ito et al. ........................ 257/741 |

* cited by examiner

*Primary Examiner* — Savitr Mulpuri (74) *Attorney, Agent, or Firm* — Slater and Matsil, L.L.P.

(57) ABSTRACT

Methods for forming uniformly spaced and uniformly shaped fine lines in semiconductor processes using double patterning. Dummy lines are formed over a substrate. Sidewall spacer material is deposited over the top and sides of each of the dummy lines. Etching is performed to remove the top surface sidewall spacer material from the tops of the dummy lines. The dummy material is removed by selective etching leaving the spacer material. A photolithographic mask is formed defining inner lines that are desired for a substrate etching step, and temporary lines outside of the desired lines. The temporary lines are partially masked. The temporary lines are partially removed while the inner desired lines are retained. A transfer etch process then patterns an underlying mask layer corresponding to the inner desired lines, and the mask layer is used for etching lines in an underlying semiconductor substrate.

20 Claims, 13 Drawing Sheets

METHODS FOR CONTROLLING LINE DIMENSIONS IN SPACER ALIGNMENT DOUBLE PATTERNING SEMICONDUCTOR PROCESSING

BACKGROUND

Continuing reduction of the minimum features produced by semiconductor processes and reduction in the size of the resulting devices has enabled continued improvements in speed, performance, density, and cost per unit function of integrated circuits and systems. As semiconductor process nodes continue to shrink, critical dimensions ("CD") of the semiconductor devices have approached and even surpassed the theoretical limits of photolithography equipment. At the semiconductor process nodes now being developed, the CD spacing desired is less than the spacing that can be resolved using optical masks and photolithography equipment.

An approach used to achieve the finer resolutions now required is to use double patterning. For example, a "half pitch" line spacing (half of the minimum photolithographic pitch for a given numerical aperture ("NA") for the photolithography system) can be achieved by using sidewall aligned spacers by forming dummy lines, for example at the minimum available pitch from the photolithographic system, then forming sidewalls on the dummy lines, removing the dummy lines by a selective removal that leaves the sidewalls, and then using the sidewalls as etch patterning masks, transferring the sidewall pattern to underlying layers using selective etch processes. In this manner, a line spacing that is approximately half the minimum pitch can be achieved.

Very fine lines are increasingly used to form structures in semiconductor devices. Recent advances in transistor structures include the use of "FinFET" transistors. In a FinFET, a layer of semiconductor material or a substrate is patterned to form a "fin" shape, which is a thin vertical protrusion extending above the remaining material. A gate dielectric strip is disposed over the sidewalls and sometimes over the top of the fin. A gate conductor is then formed conformally over the gate dielectric. In this manner the gate width of an MOSFET device, for example, may be greatly increased while the silicon area needed for that device is not proportionally increased, due to the use of the area of the vertical fin sidewalls to extend the gate width. Higher performance MOSFET devices may be thus achieved at lower process node sizes, without an undesirable increase in the silicon area needed for each device. The transistor performance can be further increased by using a common gate dielectric and conductor over several fins, further increasing the gate width.

In order to form the fine structures needed at current and future advanced semiconductor processing nodes, such as at 32 nanometer, 28 nanometer, or 22 nanometer semiconductor process nodes and beyond, double patterning will likely be used. Current process approaches to double patterning of fine lines at the "half-pitch" (lines patterned at half of the pitch available from the photolithographic patterning process) exhibit unacceptable uniformity problems related to mask loading and etch bias effects. The outer lines formed in a plurality of lines using the conventional approaches may exhibit a different width than the inner lines formed in a plurality of parallel lines, due to etch bias problems. Isolated lines may also exhibit etch bias non-uniformity. These characteristics make it difficult or impractical to provide the uniform line widths and uniform line spacing required for forming advanced devices, for example, for providing fins for finFET transistors.

BRIEF DESCRIPTION OF THE DRAWINGS

For a more complete understanding of the illustrative embodiments, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the preferred embodiments and are not necessarily drawn to scale.

DETAILED DESCRIPTION OF ILLUSTRATIVE EMBODIMENTS

The making and using of the presently preferred embodiments are discussed in detail below. It should be appreciated, however, that an illustrative embodiment provides many applicable inventive concepts that can be embodied in a wide variety of specific contexts. The specific embodiments discussed are merely illustrative of specific ways to make and use the embodiments, and these examples do not limit the scope of this description and do not limit the scope of the appended claims.

The embodiments herein are illustrative examples but do not limit the scope of the disclosure and do not limit the scope of the appended claims. Embodiments of this disclosure include methods for reducing or eliminating etch bias effects in double patterning of fine lines in a semiconductor process. In particular, etch bias effects that occur in transferring the half pitch sidewall pattern to hardmask layers in conventional processes is reduced or eliminated.

In the embodiment methods a dummy layer is patterned and sidewall spacers are formed into half-pitch lines. The sidewall spacer lines include temporary lines formed at the outside of a pattern of a plurality of spacer lines that are desired. Using a second photolithographic patterning step, the temporary spacer lines are thinned more than the desired lines, but not entirely removed. By etching the thinned temporary lines and the wider desired lines together during pattern transfer to the final mask layers, the mask loading effects are eliminated. The portions of the final mask layer underlying the temporary spacer lines are then removed, and when the final silicon etch is performed using the embodiments, the desired lines that remain in the final mask layer form silicon lines that exhibit uniform line widths and uniform spacing and do not have mask loading effects in the line dimensions. Isolated lines, and densely grouped lines, in the same layer will have uniform widths when the temporary lines are used in the etch steps. The resulting structures meet the requirements for forming, for example, finFET devices with more uniform device performance. Yields in the completed integrated circuit devices therefore improve, lowering costs, and preventing defects.

Although the embodiments are described with respect to illustrative examples in a specific context, namely double patterning using sidewall spacer alignment, etching, and deposition steps used in patterning silicon fins, the use of the embodiments may also be used to pattern other structures in other semiconductor processes where mask loading or etch bias effects in otherwise occur. The embodiment methods and apparatus are not limited to the example processes described herein and the illustrative examples do not limit the appended claims.

Figure 1:
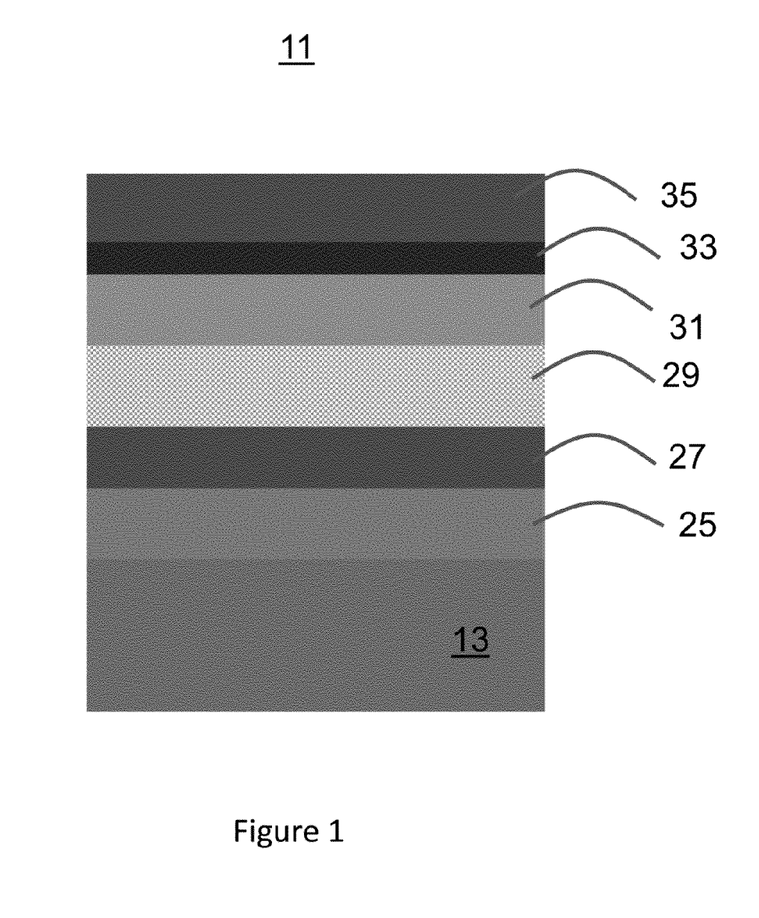
FIG. 1 depicts a cross-sectional view of a structure at an intermediate process step to illustrate the use of the embodiments.

FIG. 1 depicts in a cross-sectional view a first intermediate process stage for forming fine line features, such as the fins for finFET devices, in a substrate. Note that the substrate may be a silicon substrate or other semiconductor material. Gallium arsenide, germanium, silicon carbide, indium arsenide or indium phosphide or alloy semiconductors such as silicon germanium carbide, gallium indium phosphide, gallium indium arsenide, and the like may be used. The substrate may typically be a wafer of semiconductor material. However, as the embodiment methods enable fine line patterning in etch processes, the substrate need not be limited to semiconductor materials. Other materials that are patterned, such as glass substrates, fused quartz, calcium fluoride materials may be patterned using the embodiments. In still other embodiments the silicon substrate could instead be provided as an epitaxial layer over an insulator, such as an "SOI" layer. Wafers of semiconductor material may be bonded or stacked and the semiconductor substrate may be one of these layers.

In addition to the example structures described herein, the substrate may also include other devices including active transistors, diodes, capacitors, inductors, resistors, bipolar and MOSFET devices, memory cells, analog devices, filters, transceivers, and the like formed in another portion of the substrate. Also, following the embodiment etching steps described herein for etching the substrate, interlayer dielectrics, conductors, additional devices formed in upper layers, and packaging material may be disposed over the substrate to form a complete microelectronic component such as an integrated circuit, solar cell, processor, or the like.

To define the lines using double patterning and sidewall spacer alignment, several processing steps are performed. In order to better illustrate the application of the embodiments, the processing steps performed with the use of the embodiments will now be briefly described.

In FIG. 1, the cross-section illustrates a plurality of layers formed over the silicon substrate 13. A tri-layer photoresist may be used, including a photoresist (PR) layer 35 as the top or uppermost portion, a middle layer 33, and a bottom layer 31. As the limits of photolithographic processes are reached by advanced semiconductor processes, the need for thinner photoresist layers PR has arisen. However, the thin PR layers may not be sufficiently robust to support the etching of the target layers. Tri-layer resists provide a thin photoresist layer such as 35, a middle layer which may include anti-reflective materials (ARC) or backside anti-reflective materials (BARC) to aid in the exposure and focus of the PR processing, and a bottom layer which may be a hardmask material; for example, a nitride. To pattern a tri-layer photoresist, the top layer is patterned using a mask, exposure to radiation, such as light or an excimer laser, for example, a bake or cure operation to harden the resist, and use of a developer to remove either the exposed or unexposed portions of the resist, depending on whether a positive resist or a negative resist is used, to form the pattern from the mask in the PR layer 35. This patterned top layer is then used to etch the underlying PR layers 33 and 31 to form an etch mask for the target layer; here, layer 29.

A dummy layer 29 is shown below the bottom layer 31 of the resist; this dummy layer 29 will be etched to form the dummy core lines. Dummy layer 29 may be a polymer, an amorphous carbon film, an amorphous silicon, polysilicon, or other material that may be patterned and selectively etched in an efficient manner.

Layers 27, and 25 form mask or buffer layers over substrate 13. A mask of silicon dioxide or other oxide layer 27 is shown over a nitride containing hardmask layer 25 and then a thin oxide buffer layer 23 is shown over the substrate 13. An optional thin buffer layer (not shown); for example, of silicon dioxide, may be formed over substrate 13 underlying mask layer 25.

Layer 25 may be SiNx, such as silicon nitride ($Si_3N_4$) or SiON, for example. This film may be formed by chemical vapor deposition (CVD), low pressure CVD (LPCVD) plasma enhanced CVD (PECVD) or other nitride deposition techniques. In example embodiments, layer 25 may be between about 200-2000 Angstroms.

Layer 27 is another oxide layer and may, for example, be of silicon oxide, $SiO_2$, or other oxides. This layer may also be formed using CVD, PECVD, or TEOS for example. In example embodiments, this layer may be between 100-800 Angstroms thick.

Layers 27 and 25 form mask layers and are formed of different materials to allow for selective etching and also, in the embodiments, some non-selective etching to support pattern transfer. These mask layers are used to set up a later substrate etching operation to pattern the substrate 13. These layers may be varied from the example embodiments described here, for example silicon nitride layers and silicon oxide layers may be switched, or other dielectrics may be used, these alternatives are contemplated as additional embodiments and the embodiments, and the appended claims, are not limited to the illustrative examples presented herein. Generally the use of different materials in the mask layers has advantages in selective etching to remove the layers once the operations are completed, without removing the underlying layers.

Dummy layer 29 may be a polysilicon film, for example. Alternatives include polymer layers. In one example embodiment, the thickness may range from 500-3000 Angstroms.

The tri-layer photoresist includes a bottom layer, a middle layer, and a photoresist (PR) top layer. The top PR layer 35 may be between 700-2000 Angstroms. The middle layer may be between 300-1000 Angstroms. The bottom layer may be between 500-3000 Angstroms thick.

Figure 2:
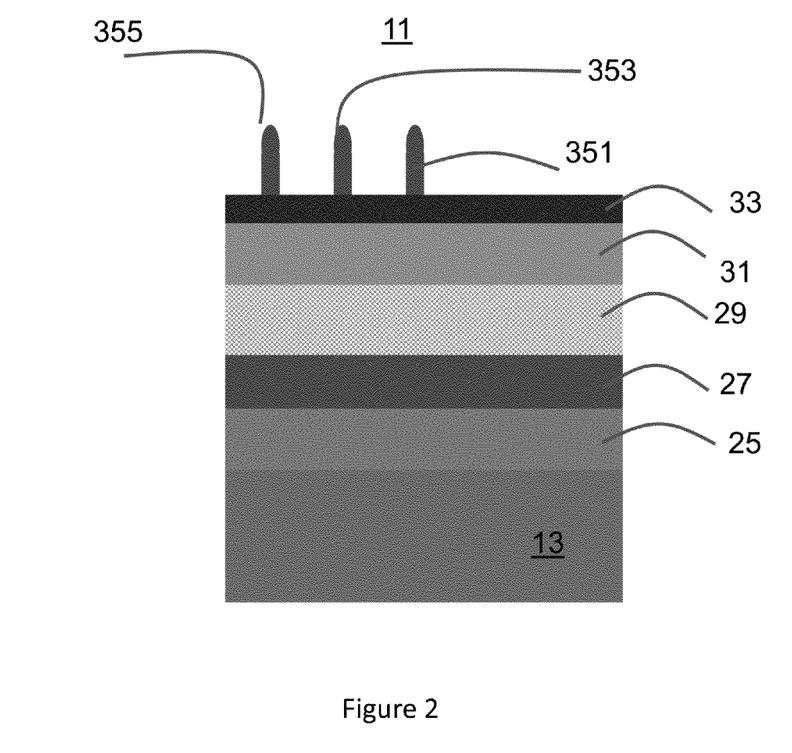
FIG. 2 depicts in a cross-sectional view the structure of FIG. 1 following additional processing.

FIG. 2 depicts the intermediate structure 11 of FIG. 1 following additional processing steps. In FIG. 2, the top PR layer 35 has been patterned by exposing the layer to an optical mask and exposure with radiated energy such as UV light or an excimer laser or other light source to expose the photoresist. The exposed portions may be hardened by baking for example and developed. Developing may be performed, for example, using chemical developers to remove the unexposed portions. After the unexposed material is removed, fine lines 355, 353 and 351 then remain. In the steps that follow, the pattern of these lines will be transferred from the PR layers to the dummy layer 29.

In FIG. 2, the intermediate structure 11 of FIG. 1 is depicted following additional processing steps. To transition from the intermediate structure 11 of FIG. 1 to the structure of FIG. 2, additional etch processing of the middle layer and bottom layer of the tri-layer resist was performed. After the etch steps of FIG. 2, the tri layer photoresist is patterned by conventional etching to form a plurality of parallel lines over the dummy layer. This is illustrated in cross-section in FIG. 3.

Figure 3:
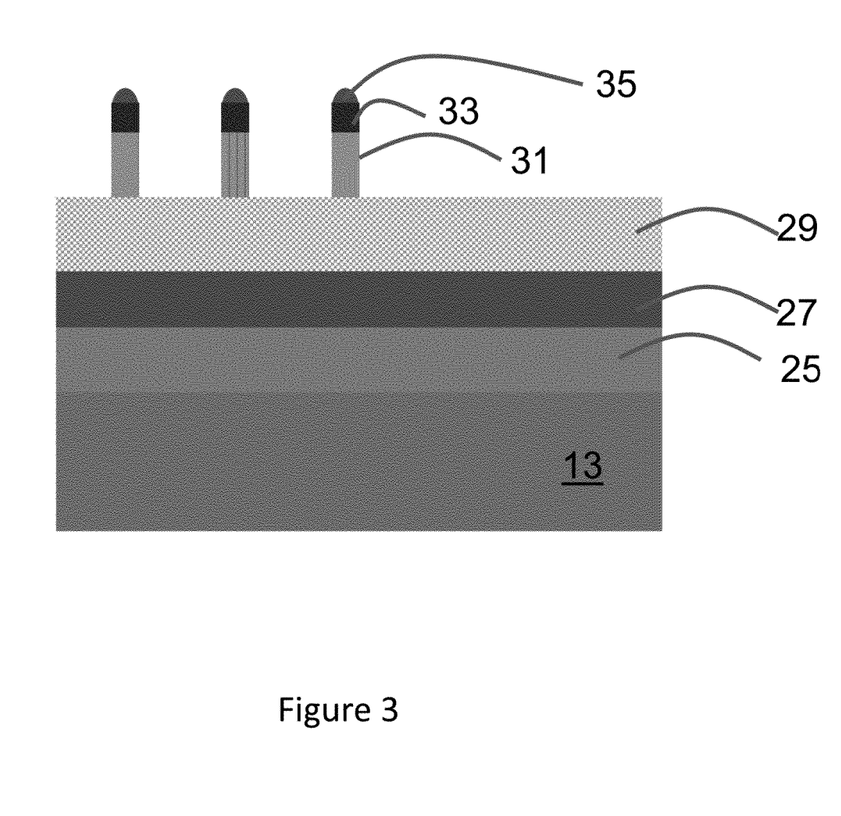
FIG. 3 depicts in a cross-sectional view the structure of FIG. 2 following additional processing.

FIG. 3 depicts the intermediate structure 11 of FIG. 2 following additional processing of the tri-layer photoresist features. In FIG. 3, the tri-layer photoresist has been processed using selective etchants to transfer the pattern from top PR layer 35 to the middle layer 33 and the bottom layer 31.

Figure 4:
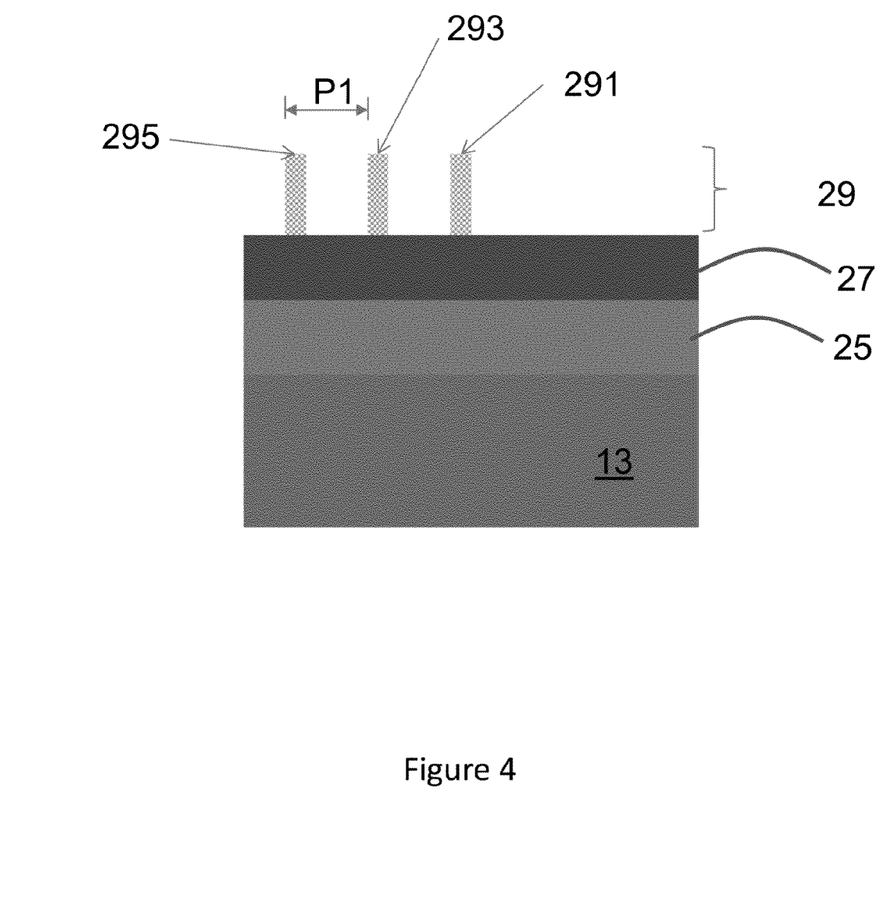
FIG. 4 depicts in a cross-sectional view the structure of FIG. 3 following additional processing.

In FIG. 4, the intermediate structure of FIG. 3 is shown following the etch of the dummy layer. A plurality of dummy lines 291, 293, 295 is shown in parallel, corresponding to the pattern defined by the tri-layer photoresist of FIG. 2 after a dummy layer etch step. An ashing step such as a plasma ash is then performed to remove the remaining tri-layer photoresist layers, and a wet clean may be performed to clean the etch residues from the dummy layer lines to leave the structure shown in FIG. 4.

The width of the lines 295, 293, 291, including the spacing between them, forms a first pitch which is labeled "P1" in FIG. 4. If this pitch is the smallest pitch the photolithographic system can provided, it may be a "minimum pitch".

Figure 5:
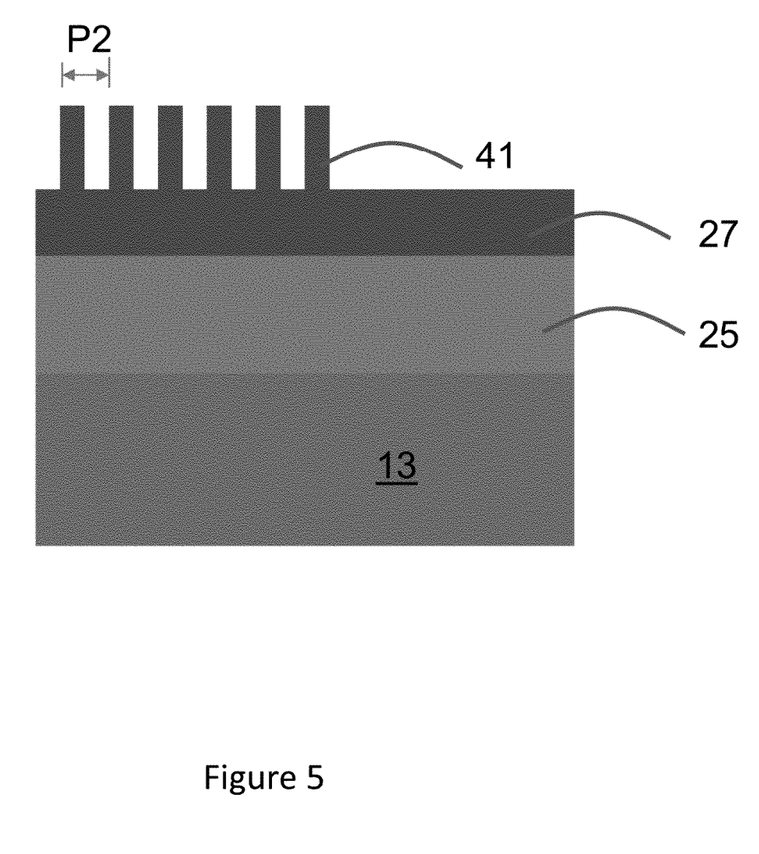
FIG. 5 depicts in a cross-sectional view the structure of FIG. 4 following additional processing.

In FIG. 5, lines are shown in a sidewall spacer layer 41 after a deposition step and following dummy layer removal. After the spacer material is deposited, it is etched away from the top surfaces of the dummy material, and from between the dummy lines. The dummy material is then removed, for example by selective etching.

In an example embodiment, deposition of a nitride containing layer 41 is performed. The layer may be silicon nitride, or other nitride containing sidewall layer materials. However, other materials may be used and these alternatives are contemplated as additional embodiments. The thickness of the sidewalls will determine the thickness of the fine line structures eventually formed in the silicon substrate, and may be from 100 to 400 Angstroms in the current advanced semiconductor process nodes. Other thicknesses may be used and will form additional alternative embodiments.

The thickness of the sidewall layer 41, and the width and spacing of the dummy lines (295, 293, 291 of FIG. 4) may be selected so that the resulting spacer lines in layer 41 of FIG. 5 are at a "half pitch" P2 (for example, ½ of P1) and this may be the "minimum" pitch available for a process node. Larger pitch distances may also be used.

Figure 6:
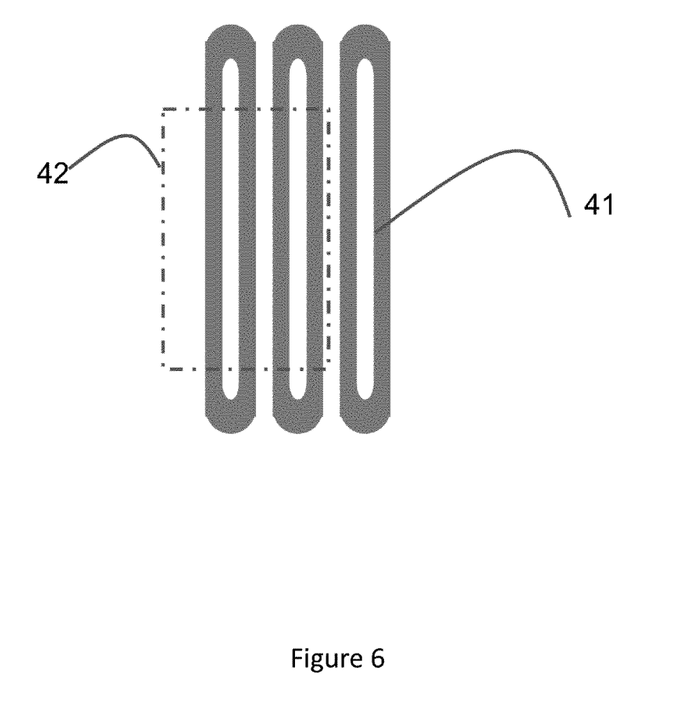
FIG. 6 depicts in a plan view the structure of FIG. 5.

FIG. 6 depicts in a plan view the spacer material layer 41 from FIG. 5. In FIG. 6, a desired "cut line" 42 is shown. In this example, the cut line 42 cuts the end material from the spacer layers 41 and also, defines some of the lines that are to be retained and some that are not to be retained. In a conventional approach, photolithographic steps would be used to cut the spacer layer 41 between the lines as shown by the cut line 42. However, this approach results etch bias effects on the outside lines in later steps. The outer spacer lines, when used as etch masks, will tend to form non uniform lines in lower layers (such as hardmask layers). The inner lines will be more uniform in width so that non uniform features result. Use of the embodiments as described below advantageously reduces or eliminates the etch bias problems of the conventional process methods.

Figure 7:
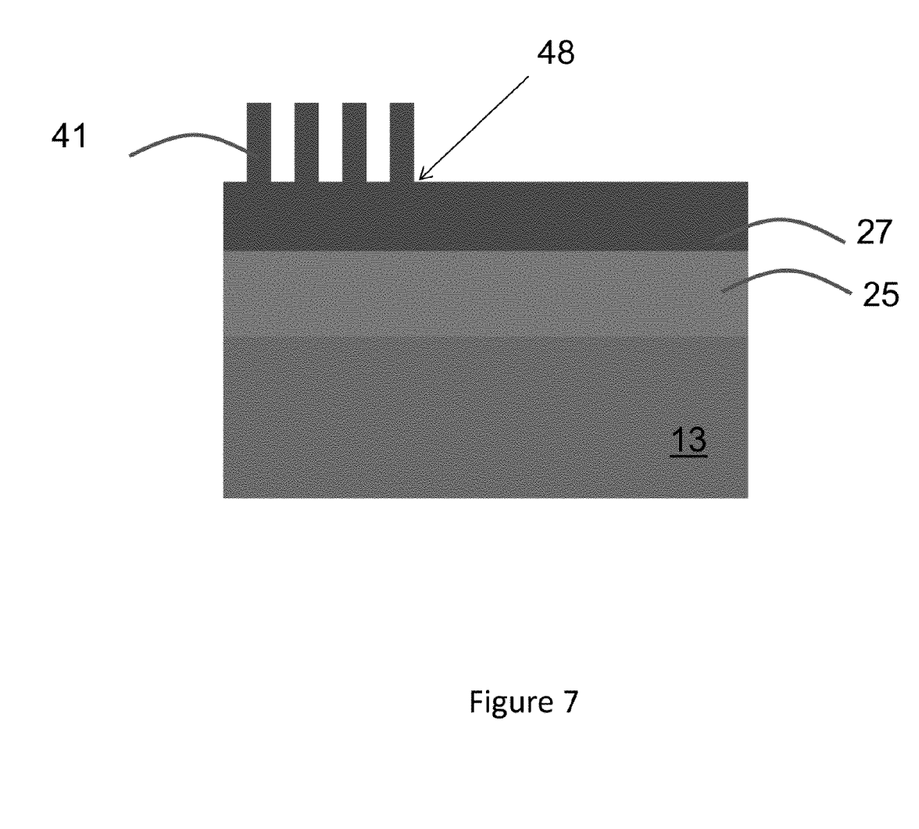
FIG. 7 depicts in a cross-sectional view the structure of FIG. 5 following additional processing.

FIG. 7 depicts in a cross-sectional view an intermediate process step showing layer 41, the spacer layer, as it would appear with the lines remaining following use of a photolithographic patterning to remove the unwanted spacer material outside the "cut line 42" in FIG. 6, above. Area 48 indicates an area in an outside spacer line where, if etching of the mask layers 27 and 25 were performed in a conventional process, etch bias effects may occur.

In an embodiment, a method includes providing a pattern of lines in a layer, such as an upper mask layer, and defining at least one temporary line on the outside of one or more permanent lines in the pattern of lines, and performing a photolithographic process to remove any unwanted lines and to cut through the at least one temporary line so that it has a reduced width. The at least one permanent line retains its width. In an example, several adjacent permanent lines are formed with at least two temporary lines, on the outside of the permanent lines, and the photolithographic process cuts through the at least two temporary lines. In a subsequent etch step, a mask layer underlying the upper mask layer is etched using the permanent lines and the temporary lines in the upper layer as an etch mask. As the etch process proceeds, the permanent lines are all "inside" lines with another line adjacent each permanent line, so the etch bias effects on outer lines seen in the conventional process does not occur on the permanent lines. The temporary lines are thinner than the permanent lines and are reduced or removed by a non-selective etch process that transfers the pattern to the second mask layer. Any remaining portion of the "temporary" lines in the second mask layer may then be easily removed by a selective over etch. The permanent lines in the second mask layer are then used to pattern the substrate by a semiconductor etch such as a plasma reactive ion etch ("RIE") or dry etch process.

Figure 8:
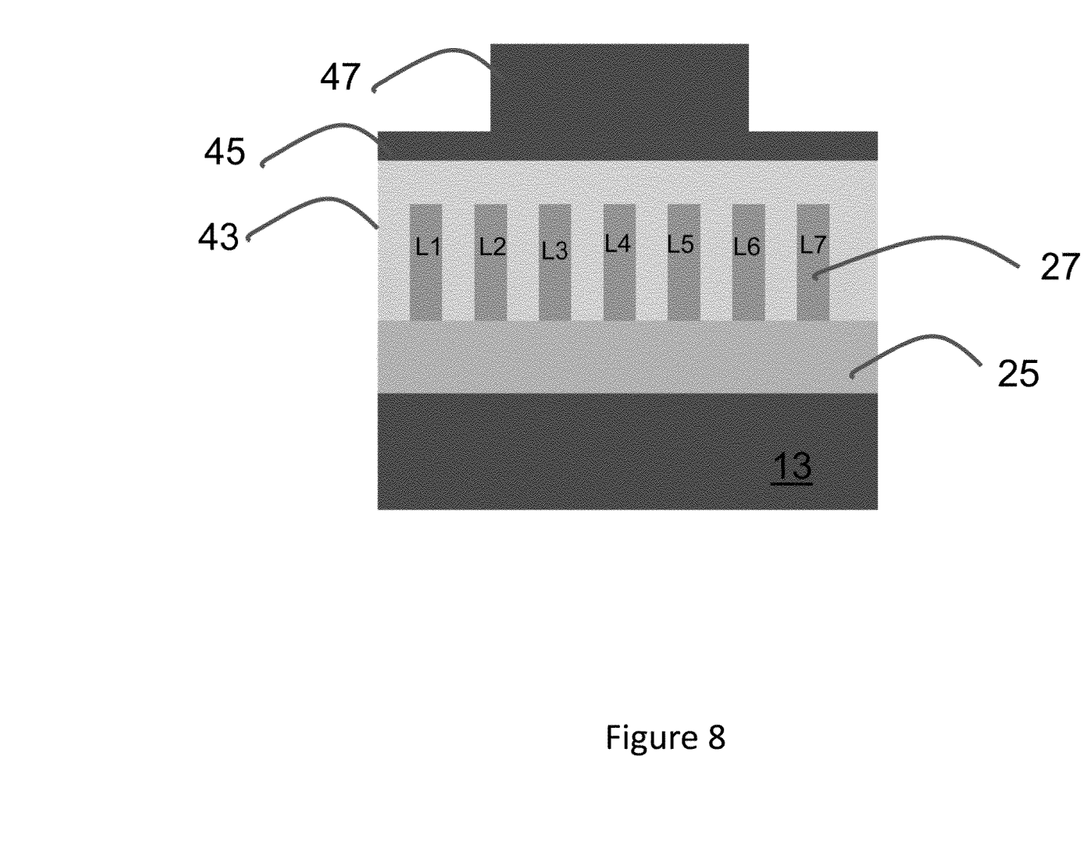
FIG. 8 depicts in a cross-sectional a semiconductor structure at an intermediate process step to illustrate the use of the embodiments.

FIG. 8 depicts in a cross-sectional view an intermediate process stage illustrating the use of the embodiments. In FIG. 8, previous steps have patterned the upper mask layer 27 using, for example, the spacer lines of FIG. 5, in this example seven lines L1-L7 have been defined and patterned by an etch process. A second photolithographic process is now performed. A tri-layer photoresist is applied using a bottom layer 43, a middle layer such as a BARC layer 45, and a top layer of photoresist 47. Top layer 47, the photoresist, is shown after being patterned using exposure, cure or bake, development and removal of the unwanted photoresist to define a cut line. Note that the edge of the outside portion of the top PR layer 47 is centered over an upper mask layer line L2. Lines L2 and L6 will be temporary lines, while the lines L3-L5 are the desired or permanent lines, lines that will be used to pattern the substrate in later steps.

Figure 9:
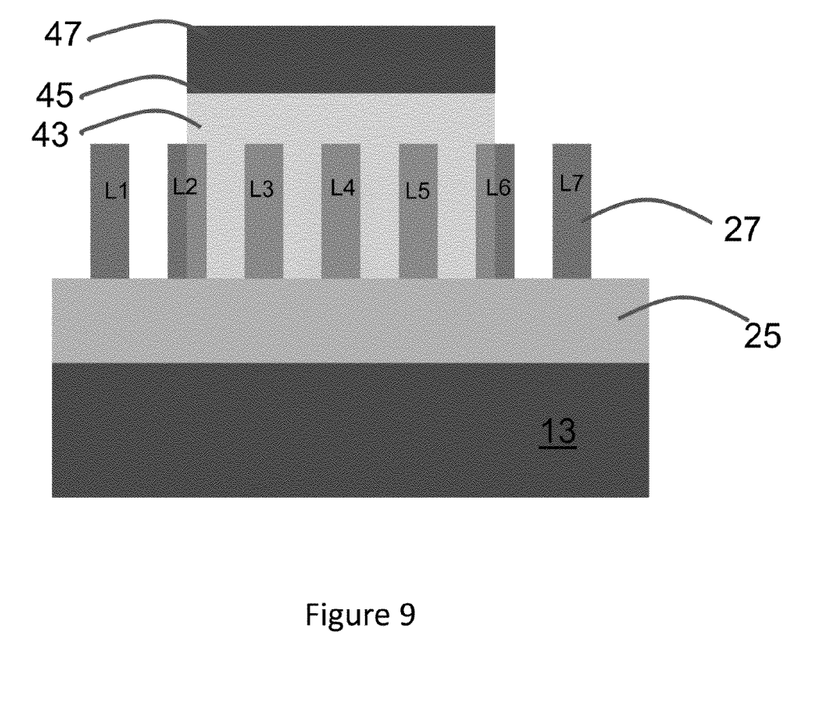
FIG. 9 depicts in a cross-sectional view the structure of FIG. 8 following additional processing steps.

FIG. 9 depicts the structure of FIG. 8 in cross-section following additional processing steps. In FIG. 9, the bottom layer 43 and middle layer 45 of the tri-layer photoresist have been etched using the top PR layer 47 as a mask. Note that the outside edge of the bottom layer 43 now intersects the temporary lines, in this example lines L2 and L6, so that they will be partially removed in subsequent steps. Lines L1 and L7 are not needed and will be removed in subsequent etch steps.

Figure 10:
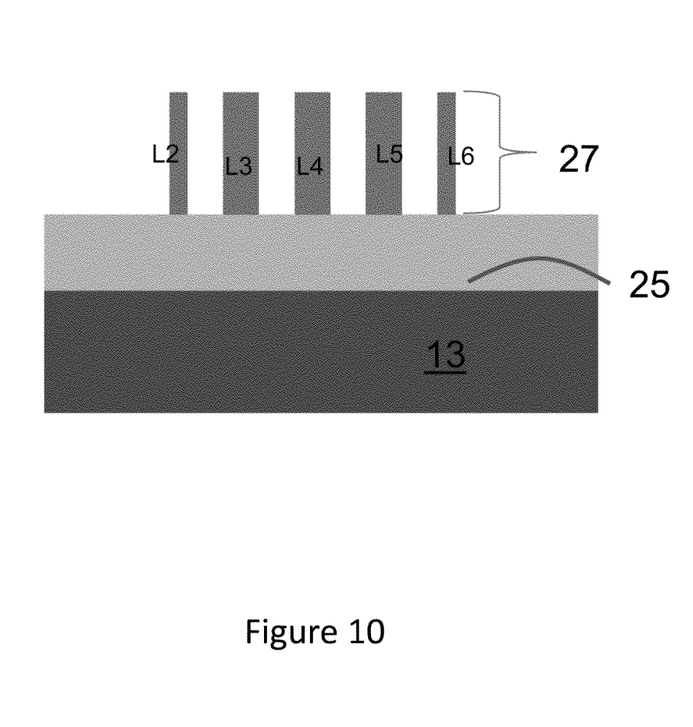
FIG. 10 depicts in a cross-sectional view the structure of FIG. 9 following additional processing steps.

FIG. 10 depicts the structure of FIG. 9 in cross-section following additional processing steps. In FIG. 10, the layer 27, the upper mask layer which may be, for example, a nitride or oxide layer, in one example this is an oxide, is selectively etched using the photoresist as a pattern. The temporary lines L2 and L6 are now cut, approximately at the center part or in half, to provide reduced width. The desired lines L3-L5 retain their original width.

Figure 11:
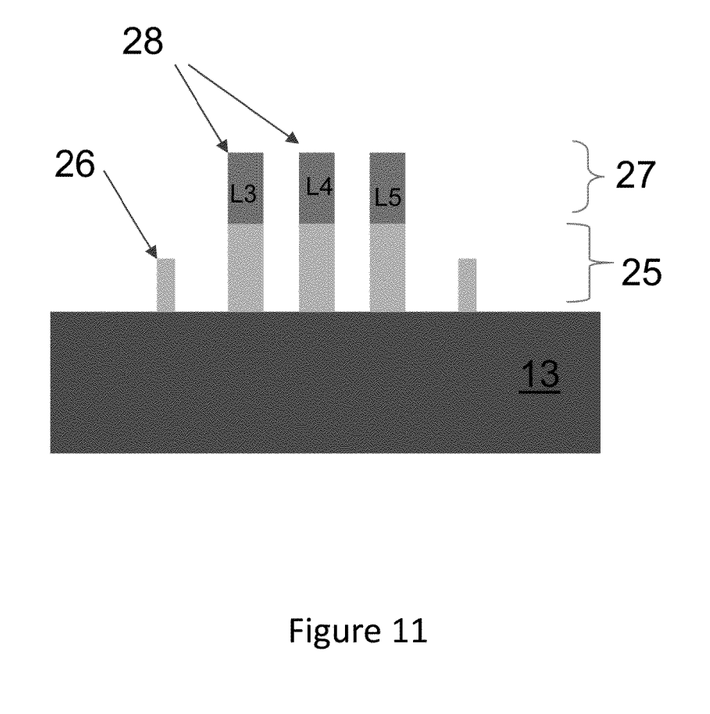
FIG. 11 depicts in a cross-sectional view the structure of FIG. 10 following additional processing steps.

FIG. 11 depicts the structure of FIG. 10 in cross-section after a non-selective etch process. Non-selective etch of layers such as oxides and nitrides may be performed by varying the chemistry, for example by varying the nitrogen content in a plasma etch, as is known. Because the temporary lines 26 outside the permanent lines L3-L5 (numbered 28 in FIG. 11) are of a reduced thickness, these lines 26 will be etched faster in a non-selective etch. As shown in FIG. 11, lines 26 may then be of reduced height and in some processes may be removed from the upper mask layer 27 altogether. A selective etch that etches the lower mask layer such as a nitride etch, for example, may then remove the remaining portions of the temporary lines from the lower layer 25 altogether. This is illustrated in the cross-section of FIG. 12, where the temporary lines are removed.

Figure 12:
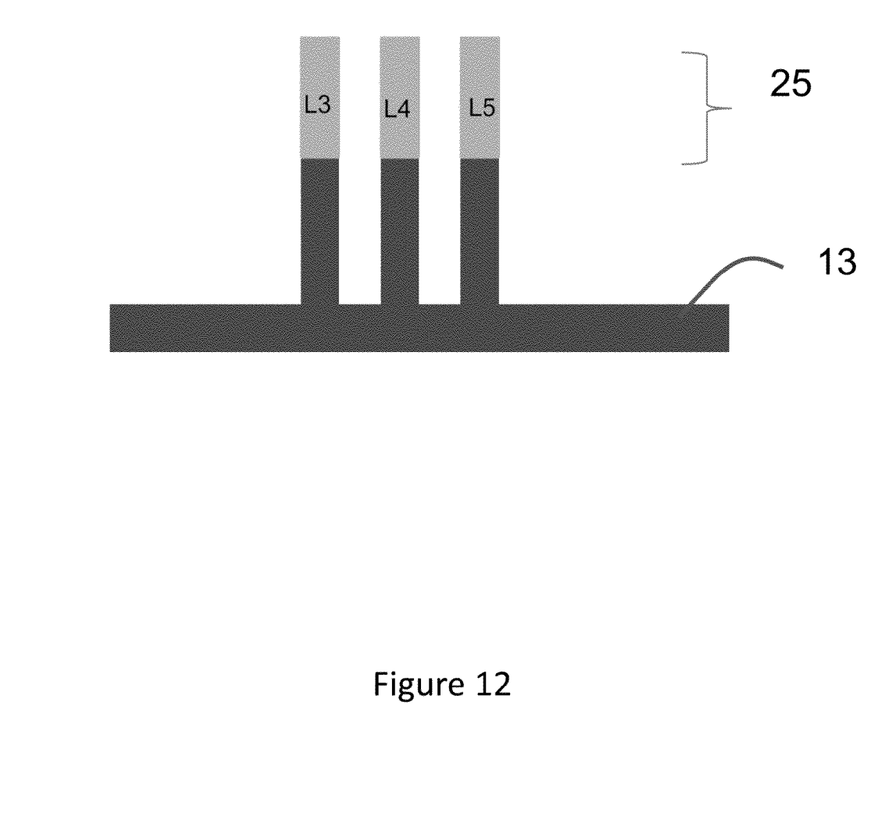
FIG. 12 depicts in a cross-sectional view the structure of FIG. 11 following additional processing steps.

In FIG. 12, the desired lines L3-L5 in the lower hardmask layer 25 are used as an etch mask in a semiconductor etch, such as a shallow trench isolation ("STI") substrate etch, which may be a dry etch or RIE etch for example, to pattern corresponding lines in the substrate 13. Because the mask lines in layer 25 that correspond to lines L3-L5 are uniform in width and spacing, the resulting patterns in the etched substrate 13 are also uniform and without etch bias effects that could occur without the use of the embodiments.

Figure 13:
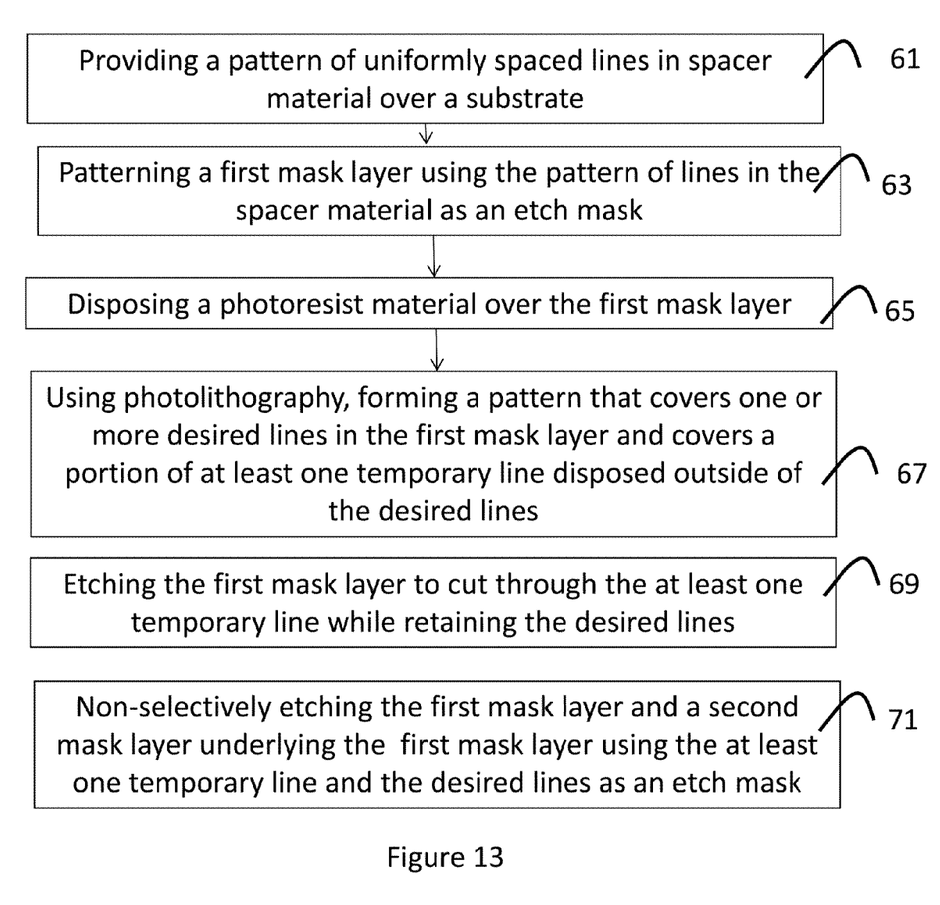
FIG. 13 depicts in a flow diagram the steps of a method embodiment.

FIG. 13 depicts in a flow diagram the steps of an example illustrative method embodiment. In FIG. 13, in step 61, a pattern of uniformly spaced lines in a spacer material is provided over a substrate. In step 63, a first mask layer is patterned using the pattern of lines as an etch mask. In step 65, a photoresist material is disposed over the first mask layer.

In step 67, photolithography is used to form a pattern that covers one or more desired lines in the first mask layer, and covers a portion of at least one temporary line disposed outside of the desired lines.

In step 69, the first mask layer is etched to cut through at least one of the temporary lines while retaining the desired lines in the first mask layer. In step 71, the first mask layer and a second mask layer underlying it are etched using the at least one temporary line and the desired lines as an etch mask. Because each of the desired lines is "inside" another line, the etching is uniform and no etch bias effects are seen on the desired lines. The temporary lines, being of reduced width, are etched faster and are partially removed during the non-selective etch of the first and second mask layers. The remaining temporary lines in the second mask layers are then easily removed by a subsequent selective etch step.

The second mask layer now forms a pattern that is uniform in width and spacing for use in patterning the substrate to form uniform structures in a substrate etch such as a shallow trench isolation etch.

Use of the embodiments advantageously provides uniform line width and spacing at advanced semiconductor processing nodes for substrate etched features, such as fins for finFET devices, without mask loading or etch bias effects. The embodiments are compatible with double patterning using spacer self-aligned processes. By providing a temporary line next to the outside lines in a plurality of desired lines, or next to a single isolated desired lines, during etch all of the desired lines have an adjacent line which eliminates the etch bias effects on the desired lines. The temporary lines have a reduced width and thus are easily eliminated prior to substrate etching.

In one embodiment, a method includes forming a first mask layer over a semiconductor substrate, forming a second mask layer over the first mask layer, and forming a dummy layer over the second mask layer; patterning a plurality of dummy lines in the dummy layer by a first photolithographic process, the dummy lines having a first width and spaced apart by a first spacing distance and having a first pitch that includes the width of a dummy line and the spacing distance; depositing a dielectric material over the dummy lines; removing the dielectric material from the top surface of the dummy lines and from the spaces between the dummy lines to form sidewall spacers adjacent each side of the dummy lines; etching the dummy material from the sidewall spacers to form a plurality of dielectric spacer lines in parallel, each having a second width and having a second pitch; etching the second mask layer using the dielectric spacer lines as an etch mask, to form a plurality of outer lines that are temporary lines outside of a plurality of desired lines inside the temporary lines all in the second mask layer; performing a second photolithographic pattern to form a photoresist that covers the desired lines and covers a portion of at least two temporary lines in the second mask layer, and etch cutting through at least two of the temporary lines so that the at least two temporary lines disposed outside of the plurality of desired lines have a second width less than the first width; and etching the second mask layer and the first mask layer using the lines in the second mask layer as an etch mask, the first mask layer being at least partially removed beneath the temporary lines to form a pattern of desired lines in the first mask layer.

In another embodiment the method further includes etching the semiconductor substrate using the pattern of desired lines in the first mask layer as an etch mask. In a further embodiment, etching the semiconductor substrate forms a plurality of parallel lines in a shallow trench isolation etch process. In still another embodiment, the second pitch is about ½ of the first pitch. In yet a further embodiment of the method, the second pitch is less than or equal to 28 nanometers. In still another embodiment of the method, patterning a plurality of dummy lines in the dummy layer by a first photolithographic process further includes depositing a photoresist over the dummy layer; exposing the photoresist using an optical mask; and removing portions of the photoresist to form a pattern of lines; and etching the dummy layer using the photoresist as an etch mask.

In a further embodiment, the above method continues by performing a second photolithographic pattern and etch cutting through at least two of the temporary lines so that the at least two temporary lines are disposed outside of and surrounding the plurality of desired lines and the temporary lines have a second width less than the first width and further includes depositing a dielectric material over and between the lines in the second mask layer; depositing a photoresist material over the dielectric material; exposing the photoresist material to an optical mask; developing the photoresist material to form a photoresist over the desired lines and at least two of the temporary lines and lying over a portion of the at least two temporary lines; and etching the second mask layer lines using the photoresist material as a mask to cut through the at least two temporary lines.

In another embodiment, in the above methods the first mask layer is a nitride. In a further embodiment of the above methods, the second mask layer is an oxide. In still another embodiment, the second pitch is a distance that is less than or equal to the minimum pitch for the semiconductor process used to perform the method.

In another embodiment, a method for forming fins for a finFET transistor includes providing a semiconductor substrate and forming a first mask layer, a second mask layer, and a dummy layer over the semiconductor substrate; using a first photolithographic patterning step, patterning a plurality of dummy lines in the dummy layer, the dummy lines having a first width and a first spacing distance and having a first pitch that is the sum of the first width and the first spacing distance; depositing a spacer material over the dummy lines; etching the spacer material from the top surface of the dummy lines and the space between the dummy lines to form sidewall spacer lines on either side of each of the dummy lines; etching the dummy lines from the spacer material to form spacer lines having a second width and a second spacing distance and having a second pitch that is less than the first pitch; etching the second mask layer to form lines in the second mask layer corresponding to the spacer lines in the spacer material; using a second photolithographic patterning step, patterning the lines in the second mask layer, cutting through a portion of a pair of temporary spacer lines in the second mask layer surrounding a plurality of desired lines so that following the cutting process, the pair of temporary lines have a width that is less than the second width of the desired lines; using the temporary lines and the desired spacer lines as an etch mask, etching the first and second mask layers with a non-selective etch, removing the second mask layer from the areas corresponding to the temporary lines and forming desired lines in the first mask layer; and using the desired lines in the first and second mask layers as an etch mask, etching the semiconductor substrate to form semiconductor fins corresponding to each of the desired lines.

In yet another embodiment, a method includes forming a mask layer and an underlying layer over a semiconductor substrate; forming a plurality of parallel lines in the mask layer having a line width and a line spacing distance and having a line pitch that is the sum of the width and the spacing distance; using a photolithographic process, patterning a photoresist to cover a plurality of the lines in the mask layer corresponding to desired lines, and patterning the photoresist to cover a portion of at least two temporary lines in the mask layer corresponding to temporary lines lying adjacent to the desired line and on the outside of the plurality of desired lines, leaving a portion of the temporary lines exposed; etching the plurality of lines in the mask layer to remove a portion of each of the at least two temporary lines while retaining the covered portion of the at least two temporary lines; and etching the mask layer and an underlying layer using the desired lines and the temporary lines as an etch mask, removing at least a portion of the underlying layer beneath the at least two temporary lines while the portions of the underlying layer lying beneath the lines corresponding to the desired lines are retained.

Although the illustrative embodiment and its advantages have been described in detail, it should be understood that various changes, substitutions, and alterations can be made herein without departing from the spirit and scope of the invention as defined by the appended claims. For example, alternate materials, implant doses and temperatures may be implemented.

Moreover, the scope of the present application is not intended to be limited to the particular embodiments of the process, machine, manufacture, composition of matter, means, methods, and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method, comprising
   forming a mask layer and an underlying layer over a semiconductor substrate;
   forming a plurality of parallel lines in the mask layer having a line width and a line spacing distance and having a line pitch that is the sum of the width and the spacing distance;
   using a photolithographic process, patterning a photoresist to cover a plurality of the lines in the mask layer corresponding to desired lines, and patterning the photoresist to cover a portion of at least two temporary lines in the mask layer corresponding to temporary lines lying adjacent to the desired lines and on the outside of a plurality of desired lines, leaving a portion of the temporary lines exposed;
   etching the plurality of lines in the mask layer to remove a portion of each of the at least two temporary lines while retaining the covered portion of the at least two temporary lines; and
   etching the mask layer and an underlying layer using the desired lines and the temporary lines as an etch mask, removing at least a portion of the underlying layer beneath the at least two temporary lines while the portions of the underlying layer lying beneath the lines corresponding to the desired lines are retained.

2. The method of claim 1, and further comprising:
   removing the remaining portion of the underlying layer lying beneath the at least two temporary lines; and
   using the retained portions of the underlying layer as an etch mask, etching the substrate to form lines corresponding to the retained lines in the mask layer, the lines in the semiconductor substrate having a width corresponding to a spacer line width and a substrate line pitch corresponding to a spacer line pitch.

3. The method of claim 2 wherein the substrate line pitch is less than or equal to 28 nanometers.

4. A method, comprising:
   forming a first mask layer over a semiconductor substrate, forming a second mask layer over the first mask layer, and forming a dummy layer over the second mask layer;
   patterning a plurality of dummy lines in the dummy layer by a first photolithographic process, the dummy lines having a first width and spaced apart by a first spacing distance and having a first pitch that includes the width of a dummy line and the spacing distance;
   depositing a dielectric material over the dummy lines;
   removing the dielectric material from a top surface of the dummy lines and from the spaces between the dummy lines to form sidewall spacers adjacent each side of the dummy lines;
   etching the dummy material from the sidewall spacers to form a plurality of dielectric spacer lines in parallel, each having a second width and having a second pitch;
   etching the second mask layer using the dielectric spacer lines as an etch mask, to form a plurality of outer lines that are temporary lines outside of a plurality of desired lines inside the temporary lines all in the second mask layer;
   performing a second photolithographic pattern to form a photoresist that covers the desired lines and covers a portion of at least two temporary lines in the second mask layer, and etch cutting through at least two of the temporary lines so that the at least two temporary lines disposed outside of the plurality of desired lines have a second width less than the first width; and etching the second mask layer and the first mask layer using the lines in the second mask layer as an etch mask, the first mask layer being at least partially removed beneath the temporary lines of the dielectric, to form a pattern of desired lines in the first mask layer.

5. The method of claim 4, and further comprising:
etching the semiconductor substrate using the pattern of desired lines in the first mask layer as an etch mask.

6. The method of claim 5, wherein etching the semiconductor substrate forms a plurality of parallel lines in shallow trench isolation etch process.

7. The method of claim 4 wherein the second pitch is about ½ of the first pitch.

8. The method of claim 7 wherein the second pitch is less than or equal to 28 nanometers.

9. The method of claim 4, wherein patterning a plurality of dummy lines in the dummy layer by a first photolithographic process further comprises:
depositing a photoresist over the dummy layer;
exposing the photoresist using an optical mask; and
removing portions of the photoresist to form a pattern of lines; and
etching the dummy layer using the photoresist as an etch mask.

10. The method of claim 4, wherein performing a second photolithographic pattern and etch cutting through at least two of the temporary lines so that the at least two temporary lines are disposed outside of and surrounding the plurality of desired lines and the temporary lines have a second width less than the first width further comprises:
depositing a dielectric material over and between the lines in the second mask layer;
depositing a photoresist material over the dielectric material;
exposing the photoresist material to an optical mask;
developing the photoresist material to form a photoresist over the desired lines and at least two of the temporary lines and lying over a portion of the at least two temporary lines; and
etching the second mask layer lines using the photoresist material as a mask to cut through the at least two temporary lines.

11. The method of claim 4, wherein the first mask layer is a nitride.

12. The method of claim 4, wherein the second mask layer is an oxide.

13. The method of claim 4, wherein the second pitch is a distance that is less than or equal to minimum pitch for a semiconductor process used to perform the method.

14. A method for forming fins for a finFET transistor, comprising:
providing a semiconductor substrate and forming a first mask layer, a second mask layer, and a dummy layer over the semiconductor substrate;

using a first photolithographic patterning step, patterning a plurality of dummy lines in the dummy layer, the dummy lines having a first width and a first spacing distance and having a first pitch that is the sum of the first width and the first spacing distance;
depositing a spacer material over the dummy lines;
etching the spacer material from a top surface of the dummy lines and the space between the dummy lines to form sidewall spacer lines on either side of each of the dummy lines;
etching the dummy lines from the spacer material to form spacer lines having a second width and a second spacing distance and having a second pitch that is less than the first pitch;
etching the second mask layer to form lines in the second mask layer corresponding to the spacer lines in the spacer material;
using a second photolithographic patterning step, patterning the lines in the second mask layer, cutting through a portion of a pair of temporary spacer lines in the second mask layer surrounding a plurality of desired lines so that following the cutting process, the pair of temporary lines have a width that is less than the second width of the desired lines;
using the temporary lines and the desired spacer lines as an etch mask, etching the first and second mask layers with a non-selective etch, removing the second mask layer from areas corresponding to the temporary lines and forming desired lines in the first mask layer; and
using the desired lines in the first and second mask layers as an etch mask, etching the semiconductor substrate to form semiconductor fins corresponding to each of the desired lines.

15. The method of claim 14, wherein the second pitch is less than or equal to half the first pitch.

16. The method of claim 14, wherein the second pitch is less than or equal to 28 nanometers.

17. The method of claim 14, wherein the second pitch is less than or equal to 22 nanometers.

18. The method of claim 14, wherein the semiconductor fins have an aspect ratio of height to width of greater than about 10.

19. The method of claim 14, wherein using a first photolithographic patterning step comprises depositing a tri-layer photoresist material over the dummy layer having a bottom layer, a middle layer, and a photoresist layer.

20. The method of claim 14, wherein etching the first and second mask layers with a non-selective etch comprises etching the second and first mask layer until the second mask layer is completely removed from the areas corresponding to the temporary lines and the first mask layer is partially removed from the areas corresponding to the temporary lines.

* * * * *